United States Patent
Yang et al.

(10) Patent No.: US 9,536,969 B2
(45) Date of Patent: Jan. 3, 2017

(54) SELF-ALIGNED SPLIT GATE FLASH MEMORY

(71) Applicant: Taiwan Semiconductor Manufacturing Co., Ltd., Hsin-Chu (TW)

(72) Inventors: Tsung-Hsueh Yang, Taichung (TW); Chung-Chiang Min, Zhubei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/493,568

(22) Filed: Sep. 23, 2014

(65) Prior Publication Data
US 2016/0086965 A1    Mar. 24, 2016

(51) Int. Cl.
*H01L 29/792* (2006.01)
*H01L 29/423* (2006.01)
*H01L 27/115* (2006.01)

(52) U.S. Cl.
CPC ..... *H01L 29/42344* (2013.01); *H01L 27/1157* (2013.01); *H01L 29/792* (2013.01)

(58) Field of Classification Search
CPC .................................................. H01L 27/11563
See application file for complete search history.

(56) References Cited

U.S. PATENT DOCUMENTS

| | | | |
|---|---|---|---|
| 8,264,030 B2 | 9/2012 | Kwon | |
| 9,023,726 B1* | 5/2015 | Cheng | H01L 21/28273 438/184 |
| 2009/0061581 A1 | 3/2009 | Tsai et al. | |
| 2014/0227843 A1* | 8/2014 | Tsukamoto | H01L 29/6659 438/275 |
| 2014/0239367 A1 | 8/2014 | Saito et al. | |

FOREIGN PATENT DOCUMENTS

JP        2011210777        10/2011

OTHER PUBLICATIONS

English translation of Korean Office Action dated Dec. 15, 2015 for co-pending Korean Application No. 10-2014-0190834.

* cited by examiner

*Primary Examiner* — Reema Patel
*Assistant Examiner* — Syed Gheyas
(74) *Attorney, Agent, or Firm* — Eschweiler & Associates, LLC (57) ABSTRACT

The present disclosure relates to a self-aligned split gate memory cell, and an associated method. The self-aligned split gate memory cell has cuboid shaped memory gate and select gate covered upper surfaces by some spacers. Thus the memory gate and select gate are protected from silicide. The memory gate and select gate are defined self-aligned by the said spacers. The memory gate and select gate are formed by etching back corresponding conductive materials not covered by the spacers instead of recess processes. Thus the memory gate and select gate have planar upper surfaces and are well defined. The disclosed device and method is also capable of further scaling since photolithography processes are reduced.

20 Claims, 8 Drawing Sheets

Fig. 5M

SELF-ALIGNED SPLIT GATE FLASH MEMORY

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells having charge storage components. Common types of flash memory cells include stacked gate memory cells, two transistor memory cells and split gate memory cells. Compared to two transistor cells, split gate memory cells have a smaller area. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Split gate flash memories typically include a pair of memory cells—namely, first and second memory cells—which are mirror images of one another, and which each store one or more bits of data. In some conventional split gate flash memory techniques, the first and second memory cells are arranged adjacent to one another and share a common source/drain region, which is separated from first and second individual source/drain regions at ends of the first and second memory cells, respectively, by first and second channel regions, respectively. The first memory cell includes a first select gate (SG) and first memory gate (MG) over the first channel region, and the second memory cell includes a second SG and second MG over the second channel region. A charge trapping layer extends under the first and second MGs and traps predetermined amounts of charge which correspond to first and second data states stored in the first and second memory cells, respectively.

To make it practical to integrate embedded flash memory with logic circuits and not cause contamination for the periphery of the chip as in conventional approaches, top surface of the SGs and MGs are covered by dielectric spacers to prevent silicide formation on these surfaces when forming the silicide layer on top of source/drain regions. Conventionally, to fabricate the MGs of this kind of flash memory cell, a conformal conductive layer is formed from upper surfaces of a semiconductor substrate extending upwardly along SGs sidewalls and over SGs upper surfaces, configured as MG precursors. Then a conformal dielectric layer is formed along the conformal conductive layer's topology, configured as MG sidewall spacer precursors. Then an etch is carried out to remove horizontal portions of the dielectric layer and the conductive layer to form a pair of sidewall spacers and a pair of MGs. Then a recess is formed in the upper surface of the MGs and is filled with a dielectric material to form spacers. The formed MGs of these approaches have a "D"- or "L"-shape with an indention on the upper surface, or in other words, have non-planar upper surfaces and sidewalls. Such MG structures have disadvantages such as their height is difficult to control, and residue may be left along sidewalls when forming the recess, which becomes a potential source of leakage.

Accordingly, the present disclosure relates to a new split gate memory cell structure disposed over a semiconductor substrate and associated processing methods. The new split gate memory cell structure comprises a pair of MGs disposed symmetrically at two sides of a pair of SGs. Both MGs and SGs have a cuboid shape with planar top surface and sidewalls. A memory gate spacer is disposed directly above the MGs and has outer and inner sidewalls aligned with outer and inner sidewalls of the MGs. To form the MGs of the new split gate memory cell, a conductive material can be formed over the semiconductor substrate and the SGs and planarized. Memory gate precursors can be formed by etching back the conductive material uniformly to a horizontal level (the height of MGs to be formed) that is lower than height of SGs. A conformal dielectric layer is formed over the memory gate precursor along upper sidewall of the SGs and over top surfaces of the SGs. Then the dielectric layer is etched to form spacers. The memory gate precursor is then patterned by spacers to form the MGs by self-alignment. The formed MGs thus have a cuboid shape and are covered by the spacers and lack a silicide/silicide thereon. When planarization is carried out, because the top surfaces of the SGs and MGs no longer include the salicide/silicide, the CMP operation will not cause contamination for the periphery of the chip as in conventional approaches. Further, the disclosed approach can pack flash cells closer and define structures more precisely because of the self-alignment. Therefore, the resultant embedded flash memory and surrounding CMOS peripheral circuitry can be manufactured with higher yield and better reliability than previous approaches. In some embodiments, these self-aligned structures form a pair of flash cells sharing a common source/drain region. This process enables formation of symmetric structures with smaller critical dimensions and, hence, denser data storage.

Figure 1:
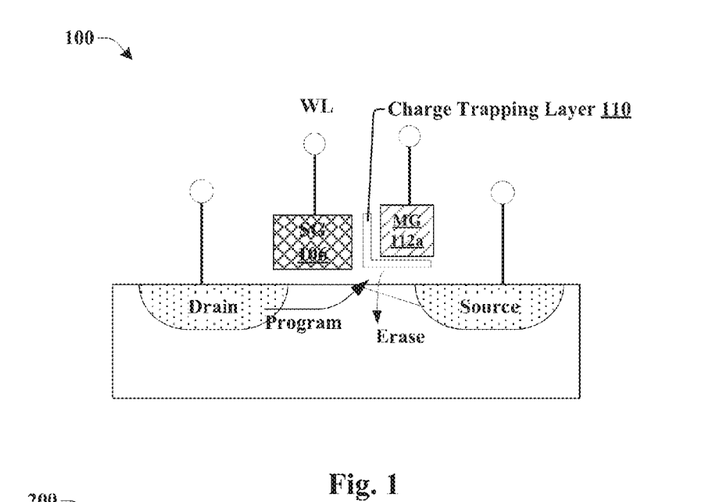
FIG. 1 illustrates a functional view of some embodiments of a split gate flash memory cell.

FIG. 1 illustrates a functional view of some embodiments of a split gate memory cell 100. The split gate memory cell 100 comprises a select gate 106 and a memory gate 112 disposed laterally between source and drain regions. The select gate (SG) 106 is connected to a word line (WL) to control the access of the split gate memory cell 100. The memory gate (MG) 112 has a charge trapping layer 110 to act as a charge storage component. Charges (electrons) can be injected to the charge trapping layer 110 through a channel between the source and drain regions. A low voltage applied to the SG 106 pinches off the channel below the SG and enhances the lateral electric field used to heat the electrons. A high vertical electric field can be applied from the MG yielding a high injection or removal efficiency. The low SG voltage helps to minimize drain current during programming, which leads to a decrease of the programming power compared to standard one-transistor NOR memories.

Figure 2:
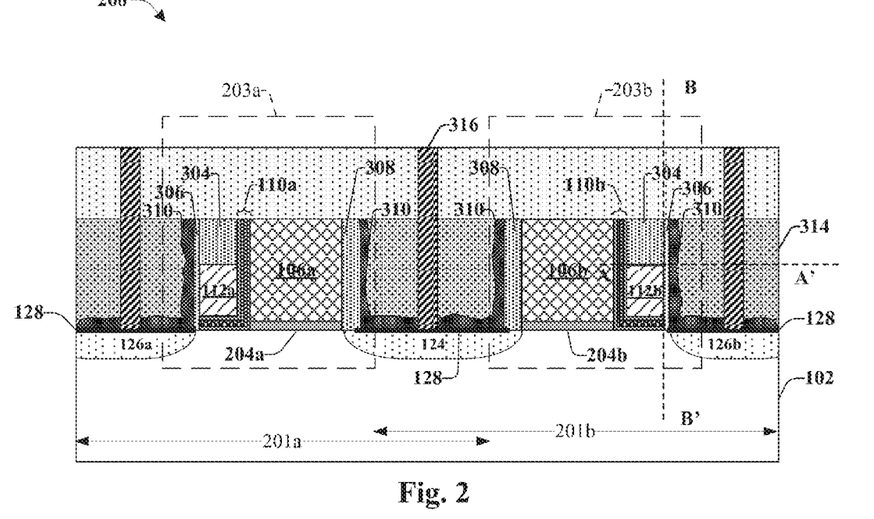
FIG. 2 illustrates a cross-sectional view of some embodiments of a pair of split gate flash memory cell.

FIG. 2 shows a cross-sectional view of a pair of split gate memory cells 201a and 201b according to some embodiments. As will be appreciated in greater detail below, the pair of split gate flash memory cells includes a first memory cell 201a and a second memory cell 201b that reside over the semiconductor substrate 102. The first and second memory cells 201a, 201b each comprises a gate structure 203a, 203b that is arranged over a channel region separating source/drain regions 124, 126 of the memory cell 201. Thus, the first memory cell 201a includes a first memory gate structure 203a arranged between a first source/drain region 126a and a second source/drain region 124; and the second memory cell 201b includes a second memory cell gate structure 203b arranged between the second source/drain region 124 and a third source/drain region 126b. The second source/drain region 124 thus acts as a shared or common source/drain (S/D) region for the first and second memory cells 201a, 201b.

The memory gate structures 203 are made of several sub-structures, including select gates 106, memory gates 112, and charge trapping layers 110, and have a memory gate lower surface that is separated from an upper surface of the semiconductor substrate by a gate dielectric layer 204. More particularly, the first memory cell gate structure 203a comprises a first select gate (SG) 106a and a first memory gate (MG) 112a; and the second memory cell gate structure 203b comprises a second SG 106b and a second MG 112b. Notably, the first and second MGs 112a, 112b and the first and second SGs 106a, 106b have a flat top surface and have a cuboid shape. A charge trapping layer 110a, 110b is arranged between neighboring sidewalls of each of the first and second SGs 106a, 106b and each of the first and second MGs 112a, 112b; and extends under each of the first and second MG 112a, 112b. The first and second memory cells 201a and 201b have symmetrical structures away from the second source/drain region 124. For simplification purposes, only structure of one (e.g. the first memory cell 201a) of the pair of memory cells is described below, but it is appreciated that the second memory cell 201b may have substantially same structure symmetrical to the first memory cell 201a.

In some embodiments, the SG 106 and MG 112 comprise doped poly silicon; however, in other embodiments the SG 106 and MG 112 can be made by other conductive materials such as metal, for example. In some embodiments, the charge trapping layer 110 comprises a first oxide layer, a nitride layer, and a second oxide layer or, which can be referred to as an oxide-nitride-oxide (ONO) structure. In some other embodiments, the charge trapping layer 110 comprises a first oxide layer, a layer of silicon dots, and a second oxide layer. During operation of the memory cell, the first and/or second oxide layers are structured to promote electron tunneling to and from the nitride layer or the silicon dots layer, such that the nitride layer or the silicon dots layer can retain trapped electrons that alter the threshold voltage of the cell in a manner that corresponds to a data state stored in the cell.

The charge trapping layer 110 is arranged between neighboring sidewalls of the SG 106 and the MG 112 and extends under the MG 112. A memory gate spacer 304 is disposed directly above the MG 112. In some embodiments, the memory gate spacer can be made of silicon nitride ($Si_3N_4$). A sidewall of the memory gate spacer 304 is vertically aligned with a sidewall of the MG 112 along a line B-B'. In some embodiments, the SG 106 or the MG 112 has a cuboid shape with planar top surfaces and sidewalls. For example, in FIG. 2, the top surface of the MG 112 is a planar surface along a horizontal line A-A'. In some embodiments, the MG 112 has a height that is smaller than a height of the neighboring SG 106. In some embodiments, a first sidewall spacer 306 can be disposed abutting an outer sidewall of the MG 112. A second sidewall spacer 308 can be disposed abutting an inner sidewall of the SG 106. In some embodiments, a silicide layer 128 is disposed over the source/drain regions 124 and 126. A contact etch stop layer (CESL) 310 can be disposed over the silicide layer 128 and exposed surfaces of the split gate memory cell 201 to provide strain stress.

In some embodiments, a dielectric liner (not shown) can be disposed between sidewalls of the charge trapping layer 110 and the first spacer 116, and between a lower surface of the first spacer 116 and an upper surface of the memory gate 112.

Figure 3A:
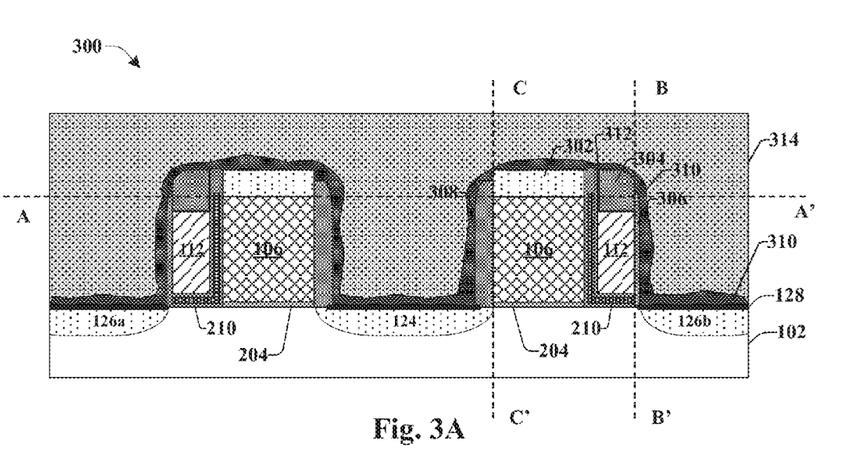
FIG. 3A illustrates a cross-sectional view of some embodiments of a pair of split gate memory cells.

FIG. 3A shows a structure of a pair of split gate memory cells 300 according to some other embodiments. Notably, the split gate memory cells 300 shown in FIG. 3A can be processed by some following fabrication steps along with various additional structures to form final packaged semiconductor devices. In FIG. 3A, a memory gate spacer 304 is arranged directly above a cuboid shaped memory gate (MG) 112. A select gate spacer 302 is arranged directly above a cuboid shaped select gate (SG) 106. An outer sidewall of the memory gate spacer 304 is aligned with an outer sidewall of the MG 112 along a line B-B'. An inner sidewall of the select gate spacer 302 is aligned with an inner sidewall of the SG 106 along a line C-C'. The outer sidewall of the MG 112 and the inner sidewall of the SG 106 are covered by a first sidewall spacer 306 and a second sidewall spacer 308, respectively. In some embodiments, a dielectric liner 312 can be disposed between an upper sidewall of the charge trapping layer 210 and an inner sidewall of the memory gate spacer 304 and extend under the memory gate spacer 304 abutting a portion of a top surface of the MG 112. In some embodiments, the memory gate spacer 304 is an integral dielectric body while it can also be several dielectric body made of same or different materials in some alternative embodiments. In some embodiments, the memory gate spacer 304 and select gate spacer 302 comprise silicon nitride ($Si_3N_4$), and the dielectric liner can be conformal liners comprising silicon dioxide ($SiO_2$).

Figure 3B:
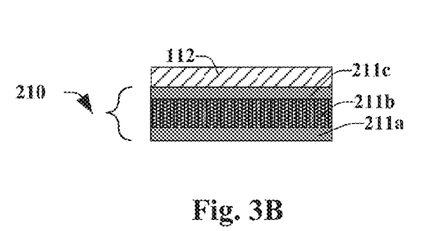
FIGS. 3B-C illustrate cross-sectional views of some embodiments of a charge trapping layer.

FIG. 3B illustrates a cross sectional view of an embodiment of the charge-trapping layer 210. In this example, the charge-trapping layer 210 comprises a first oxide layer 211a, a nitride layer 211b, and a second oxide layer 211c. During operation of the memory cell, the first and/or second oxide layers 211a, 211c are structured to promote electron tunneling to and from the nitride layer 211b, such that the nitride layer 211b can retain trapped electrons that alter the threshold voltage of the cell in a manner that corresponds to a data state stored in the cell.

Figure 3C:
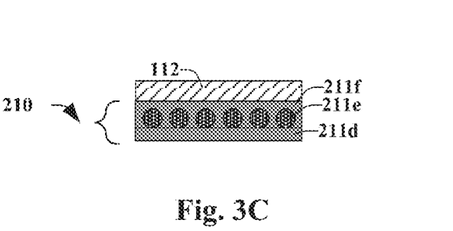

FIG. 3C illustrates a cross sectional view of an alternate embodiment of the charge-trapping layer 210. In this example, the charge-trapping layer 210 comprises a first oxide layer 211d, a layer of silicon dots 211e, and a second oxide layer 211f. During operation of the memory cell, the first and/or second oxide layers 211d, 211f are structured to promote electron tunneling to and from the layer of silicon dots 211e, such that charge can become trapped on the silicon dots and alter the threshold voltage of the cell in a manner that corresponds to a data state stored in the cell. In some embodiments, the silicon dots have diameters ranging from approximately 5 nm to approximately 20 nm.

In FIGS. 2 and 3A, the spacers cover top surfaces of the MGs and SGs, preventing formation of silicide on the top surfaces of the MGs or SGs to limit or prevent metal ion contamination during a CMP process. The covered top surfaces of the SGs and MGs may be substantially flat without indentations. Notably, though FIG. 3A shows curved surfaces of the pair of split gate memory cells, these surfaces may be planarized by subsequent processes. For example, curved top surfaces of FIG. 3A may be planarized by a CMP process reaching a flat lateral surface along a line A-A'. Remaining gate structure is similar to shown in FIG. 2.

Figure 4:
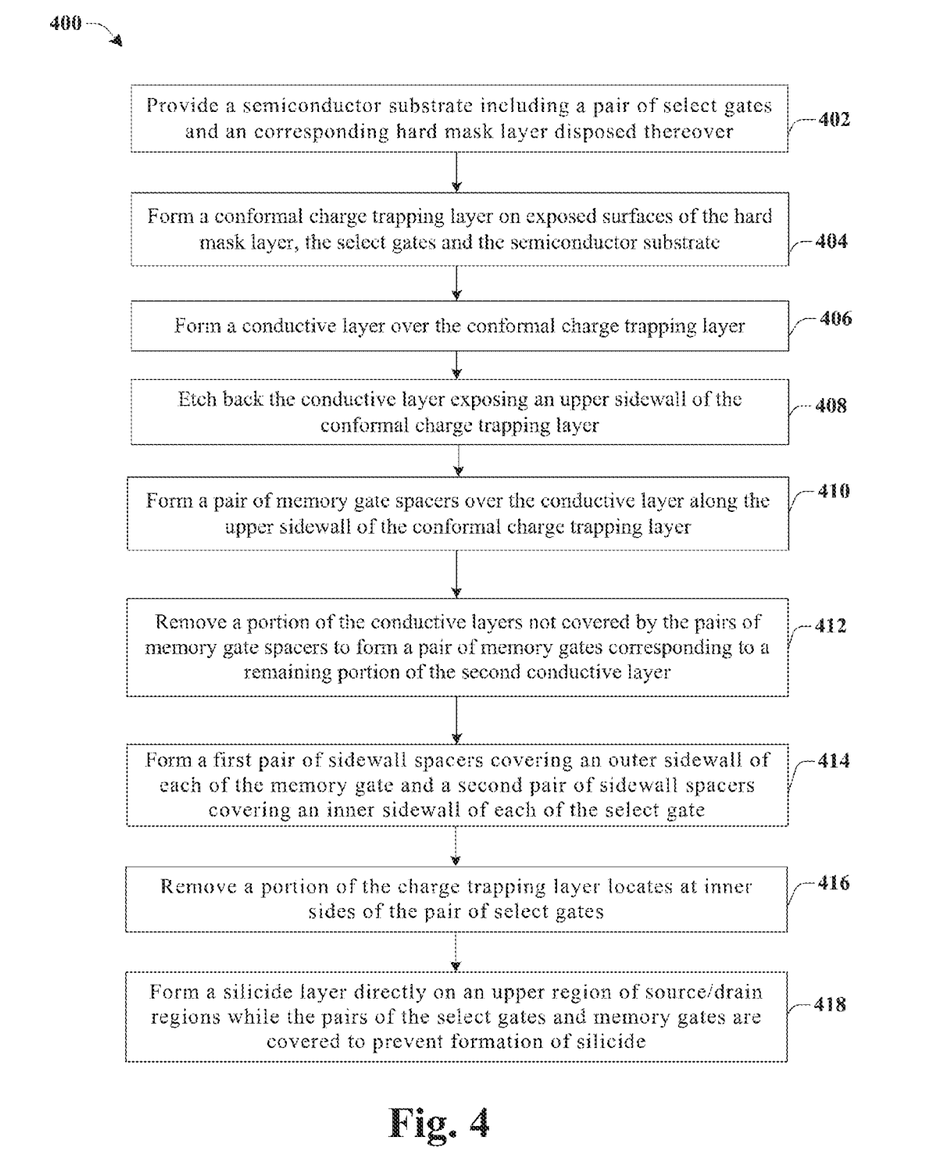
FIG. 4 illustrates a flow diagram of some embodiments of a method of forming a split gate memory cell.

FIG. 4 shows a flow diagram of a method 400 of forming a split gate memory cell according to some embodiments. While disclosed methods (e.g., method 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At Action 402, a semiconductor substrate is provided including a pair of select gates and an corresponding hard mask layer disposed thereover.

At Action 404, a conformal charge trapping layer is formed on exposed surfaces of the hard mask layer, the select gates and the semiconductor substrate. The conformal charge trapping layer is formed on the upper surface of the hard mask layer, along the hard mask sidewalls, along select gates' sidewalls, and over the upper surface of the substrate.

At Action 406, a conductive layer is formed over the conformal charge trapping layer.

At Action 408, a portion of the conductive material is removed leaving the upper sidewall of the conformal charge trapping layer and the upper surface of the hard mask layer exposed so a remaining portion of the conductive material overlies the upper surface of the semiconductor substrate.

At Action 410, a pair of memory gate spacers is formed over the conductive layer along the upper sidewall of the conformal charge trapping layer.

At Action 412, a portion of the conductive layers not covered by the pairs of memory gate spacers is removed to form a pair of memory gates corresponding to a remaining portion of the second conductive layer.

At Action 414, a first pair of sidewall spacers is formed covering an outer sidewall of each of the memory gate and a second pair of sidewall spacers is formed covering an inner sidewall of each of the select gate.

At Action 416, a portion of the charge trapping layer locates at inner sides of the pair of select gates is removed.

At Action 418, a silicide layer is formed directly on an upper region of source/drain regions while the pairs of the select gates and memory gates are covered to prevent formation of silicide.

FIGS. 5A-M show some cross-sectional views of a method of forming a pair of split gate memory cells according to some embodiments. Although FIGS. 5A-M are described in relation to method 400, it will be appreciated that the structures disclosed in FIGS. 5A-M are not limited to such a method.

Figure 5A:
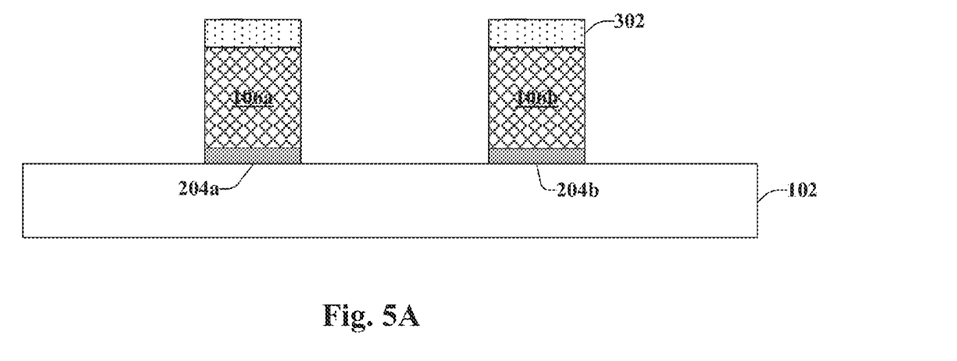
FIGS. 5A-M illustrate some embodiments of cross-sectional views of a method of forming a split gate memory cell.

As shown in FIG. 5A, a semiconductor substrate 102 is provided including a pair of select gates 106 and a corresponding hard mask layer 302 disposed thereover. A dielectric layer 204 can be disposed between the semiconductor substrate 102 and the select gates 106. The semiconductor substrate 102 is typically planar with a uniform thickness. Further, the semiconductor substrate 102 is n- or p-type, and can, for example, be a silicon wafer, such as a Si bulk wafer or a silicon-on-insulator (SOI) wafer. If present, an SOI substrate is often made up of an active layer of high quality silicon, which is arranged over a handle wafer and is separated from the handle wafer by a buried oxide layer. The first dielectric material 204 can be an oxide, such as silicon dioxide, or other high-k dielectric materials.

Figure 5B:
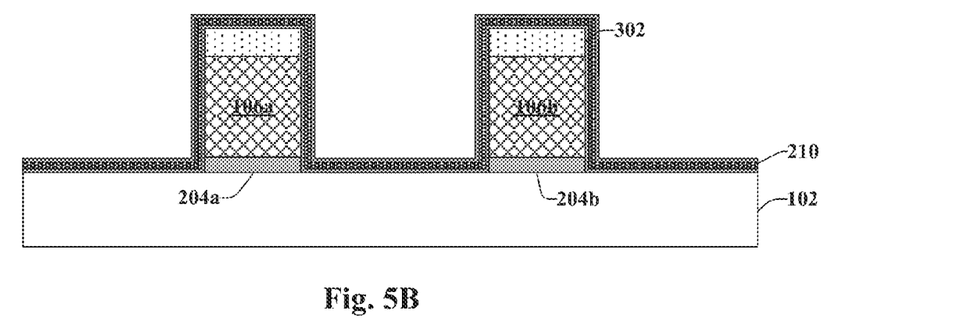

As shown in FIG. 5B, a conformal charge trapping layer 210 is formed on the upper surface of the hard mask layer 302, along the hard mask sidewalls, along select gates 106' sidewalls, and over the upper surface of the substrate 102. In some embodiments, the conformal charge trapping layer 210 can be formed by plasma enhanced chemical vapor deposition (PECVD), and can be made up of multiple layers, such as a charge trapping component sandwiched between two dielectric layers as shown in FIGS. 5B-M. In some embodiments, the charge trapping layer 210 comprises a first oxide layer, a nitride layer, and a second oxide layer or, which can be referred to as an oxide-nitride-oxide (ONO) structure. In some other embodiments, the charge trapping layer 210 comprises a first oxide layer, a layer of silicon dots, and a second oxide layer.

Figure 5C:
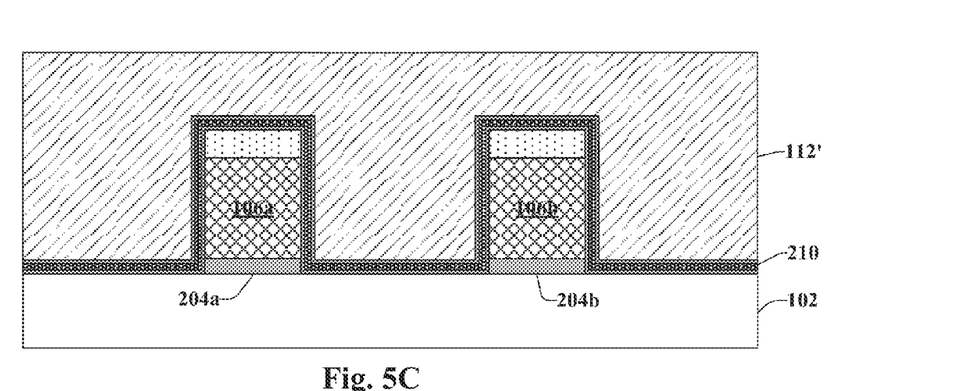

As shown in FIG. 5C, a conductive material 112' is formed over the conformal charge trapping layer 210. In some embodiments, the conductive material 112' can be, for example, doped silicon or metal.

Figure 5D:
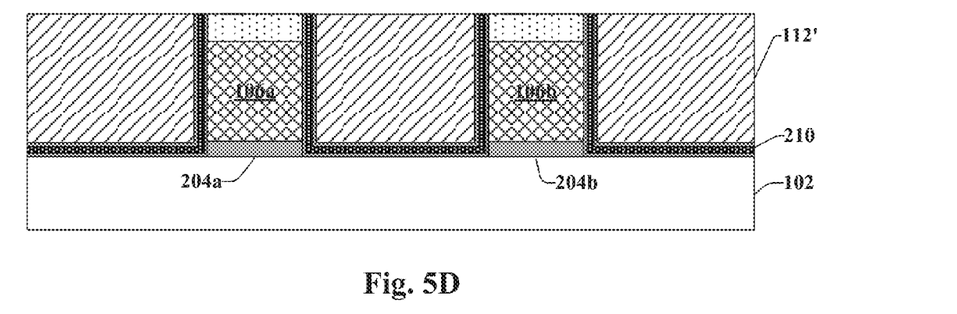

As shown in FIG. 5D, the conductive material 112' is planarized to remove an upper portion of the charge trapping layer 210 disposed excessed to the hard mask layer 302. The remaining conductive material 112' is formed symmetrically at both sides of the select gates 106.

Figure 5E:
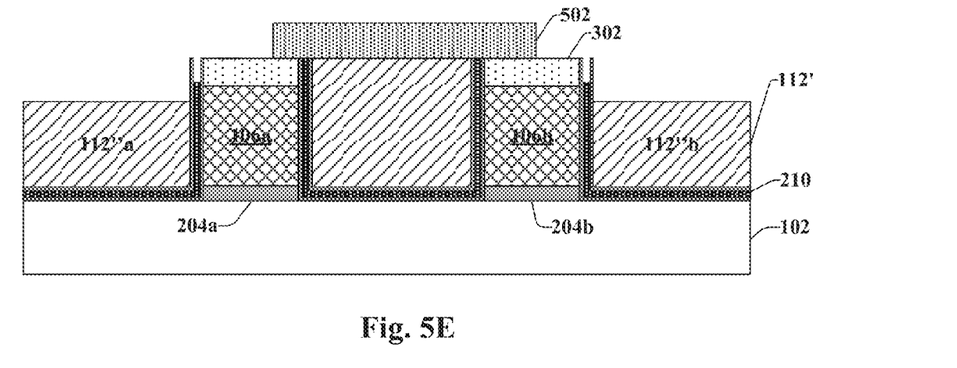

As shown in FIG. 5E, an etching back can be performed to remove an upper portion of the conductive material 112' that is disposed at outmost sides of the select gates 106. In some embodiments, a hard mask layer 502 is formed before the etching back to cover a portion of the conductive material 112' that is disposed between the pair of select gates 106. A pair of memory gate precursors 112" (112"a, 112"b) are left at both sides of the select gates 106 overlying the upper surface of the semiconductor substrate 102 apart therefrom by the charge trapping layer 210. An upper sidewall of the conformal charge trapping layer 210 is exposed. In some embodiments, an upper portion of the charge trapping component may be removed as well during the etching back process.

Figure 5F:
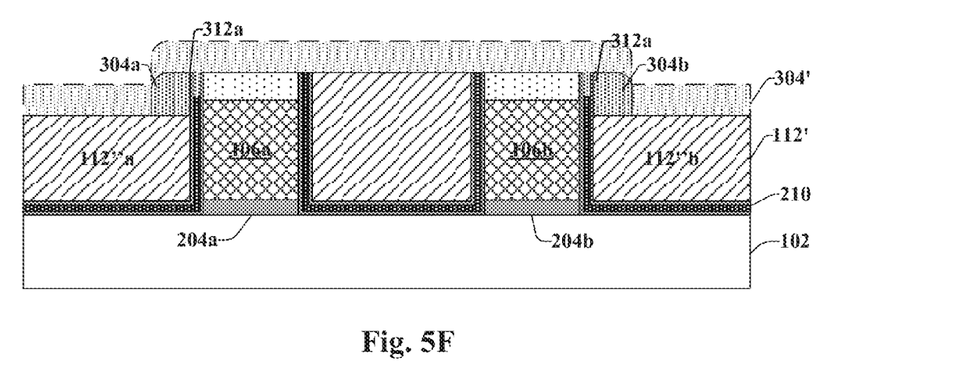

As shown in FIG. 5F, a pair of memory gate spacers 304 (304a, 304b) is formed over the remaining portions of the conductive material 112' along the upper sidewall of the conformal charge trapping layer 210. In some embodiments, a conformal dielectric layer 304', shown by broken line is firstly formed along the topology and then etched to the top surface of the conductive material 112', forming the first pair of memory gate spacers 304. The dielectric layer 304' may fill at least a portion of room of the removed charge trapping component. In some embodiments, a dielectric liner (not shown) can be formed from the top surface of the conductive material 112' extending to the upper sidewall of the charge trapping layer 210 and cover upper surfaces of the hard mask layer 302 before forming the pair of memory gate spacers 304. The dielectric liner can act as an etch stop layer with relative high selectivity and enhance adhesion of the first pair of memory gate spacers 304. As an example, the dielectric layer 304' can be made of silicon nitride and the dielectric liner can be made of silicon oxide.

Figure 5G:
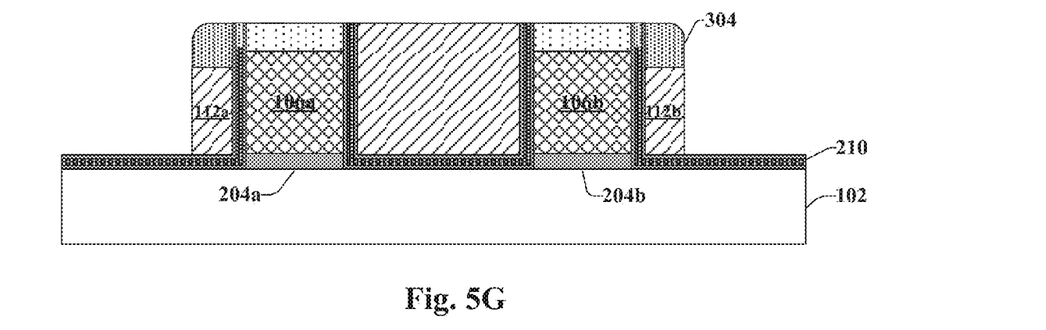

As shown in FIG. 5G, a portion of the memory gate precursors 112" not covered by the pairs of memory gate spacers 304 is removed to form a pair of memory gates 112 (112a and 112b) corresponding to a remaining portion of the memory gate precursors 112". In some embodiments, the portion of the memory gate precursors 112" is removed using dry etching. Outer sidewalls of the charge trapping layer 210, the memory gate 112 and the pair of memory gate spacers 304 are aligned.

Figure 5H:
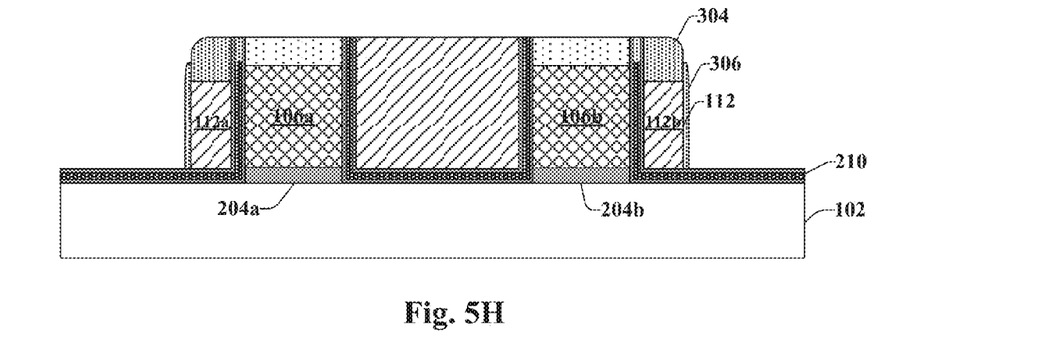

As shown in FIG. 5H, a first pair of sidewall spacers 306 is formed covering an outer sidewall of each of the memory gate 112. As an example, the sidewall spacers 306 can be made of silicon nitride.

Figure 5I:
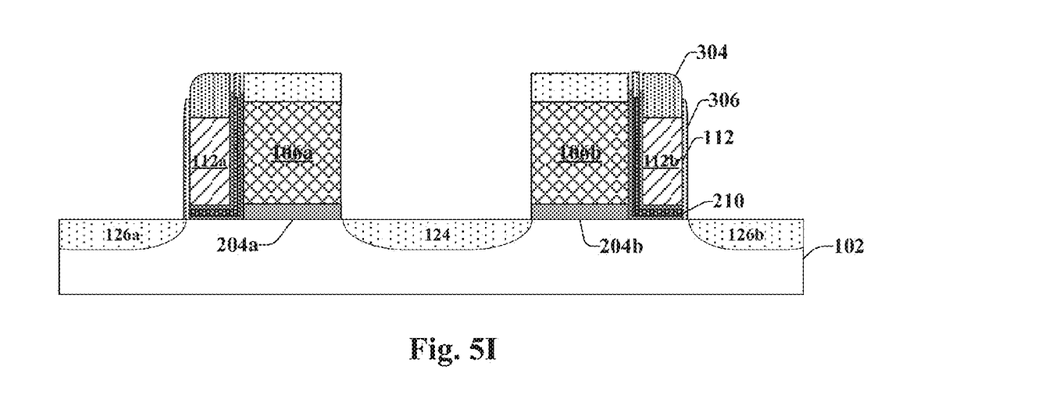

As shown in FIG. 5I, a portion of the conductive material 112' and a portion of the charge trapping layer 210 located at inner sides of the pair of select gates 106 are removed. In some embodiments, the removed portions are etched off using wet etching in order to protect the substrate 102 from damaging. In some embodiments, a portion of the dielectric component of the charge trapping layer 210 about the upper sidewall between the hard mask layer 302 and the memory gate spacers 304 may be removed at this step. In some embodiments, source/drain regions 124 and 126 are formed subsequently in the substrate 102, wherein the source/drain regions 124 and 126 are arranged between inner sidewalls of the pair of the select gates 106 and about outer sidewalls of the pair of the memory gates 112.

Figure 5J:
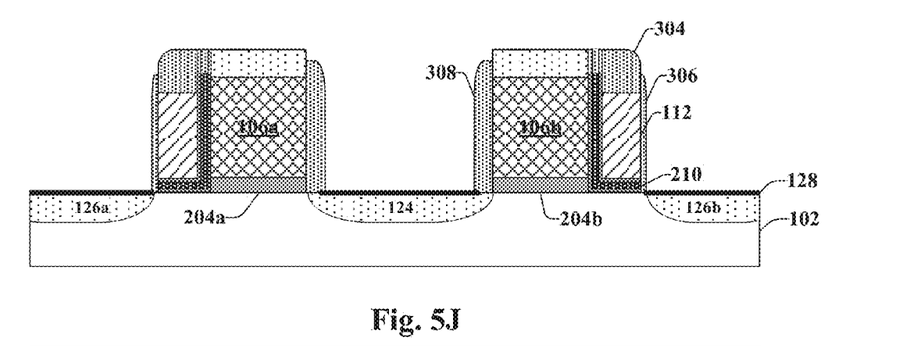

As shown in FIG. 5J, a second pair of sidewall spacers 308 is formed covering an inner sidewall of each of the select gate 106. A silicide layer 128 is formed directly on an upper region of source/drain regions 124 and 126 while the pairs of the select gates 106 and memory gates 112 are covered to prevent formation of silicide.

Figure 5K:
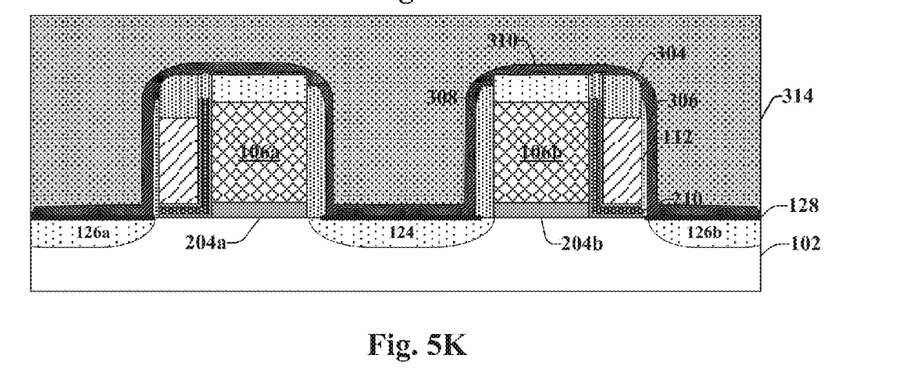

As shown in FIG. 5K, a contact etch stop layer (CESL) 310 is formed along topology and over the silicide layer 128. A dielectric layer 314, such as silicon oxide layer, is formed over the CESL 310.

Figure 5L:
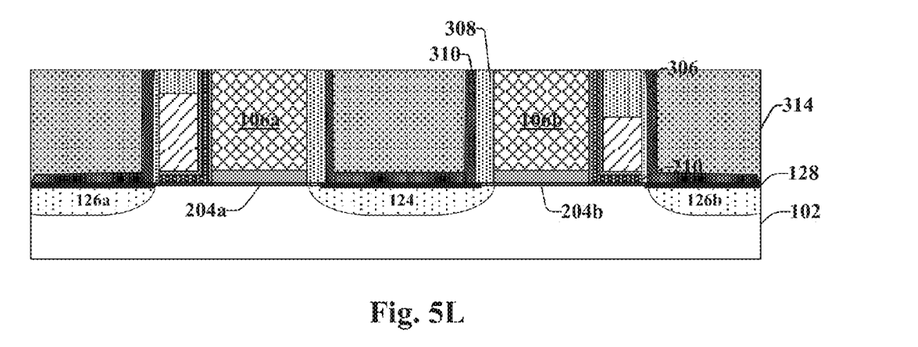

As shown in FIG. 5L, a chemical mechanical polishing (CMP) can be performed to planarize top surface of the structure.

Figure 5M:
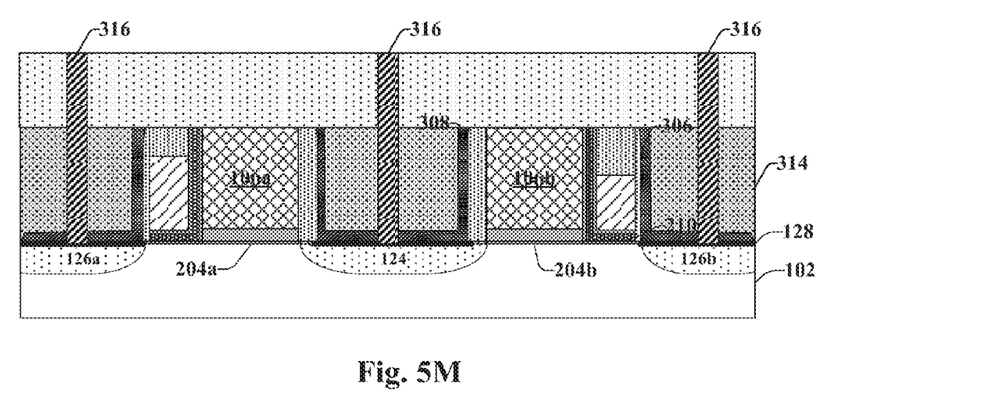

As shown in FIG. 5M, contacts are formed through the dielectric layer 314 reaching the source/drain regions 124 and 126.

Thus, as can be appreciated from above, the present disclosure provides a self-aligned split gate memory cell having memory gate and select gate covered upper surfaces by some spacers. Thus the memory gate and select gate are protected from silicide. The memory gate and select gate can have a cuboid shape with planar top surfaces and sidewalls. The memory gate can be defined self-aligned by the said spacers. The memory gate can be formed by etching back corresponding conductive materials not covered by the spacers instead of recess processes. Thus the memory gate and select gate have easy controlled heights and are well defined. The disclosed device and method is also capable of further scaling since photolithography processes are reduced.

In some embodiments, the present disclosure relates to a pair of split gate memory cells disposed over a semiconductor substrate. The pair of split gate memory cells comprises a common source/drain region, a pair of select gates and a pair of memory gates. The common source/drain region is shared by first and second memory cells disposed in the semiconductor substrate. The pair of select gates corresponds to the first and second memory cells respectively arranged on opposite sides of the common source/drain region, each of the select gates having a flat upper surface. The pair of memory gates corresponds to the first and second memory cells arranged about outermost sides of the first and second select gates respectively, each of the memory gates separated from the corresponding select gates by a charge trapping layer. The charge trapping layer extends under each of the memory gates, each of the memory gates having a cuboid shape with a flat upper surface.

In other embodiments, the present disclosure relates to a split gate memory cell. The split memory cell comprises a cuboid shaped select gate, a cuboid shaped memory gate, a memory gate spacer and source/drain regions. The select gate has a flat upper surface and is disposed over a semiconductor substrate, separated therefrom by a gate dielectric layer. The memory gate has flat upper surface and sidewall and is arranged at one side of the select gate, separated therefrom by a charge trapping layer. The charge trapping layer extends under the memory gate. The memory gate spacer is disposed directly above the memory gate. A sidewall of the memory gate spacer is aligned with the sidewall of the memory gate. The source/drain regions disposed in the semiconductor substrate at opposite sides of the select gate and the memory gate.

In yet other embodiments, the present disclosure relates to a method of forming a split gate memory cell with a self-aligned spacer. In this method, a semiconductor substrate is provided including a pair of select gates and an corresponding hard mask layer disposed thereover. Then, a conformal charge trapping layer is formed on the upper surface of the hard mask layer, along the hard mask sidewalls, along select gates' sidewalls, and over the upper surface of the substrate. Then, a memory gate material is formed over portions of the conformal charge trapping layer which overlie the upper surface of the semiconductor substrate, whereby the memory gate material leaves upper sidewalls of the charge trapping layer and an upper surface of the hard mask layer exposed. Then, a pair of memory gate spacers is formed over the conductive layer along the upper sidewall of the conformal charge trapping layer. Then, a portion of the conductive layers not covered by the pairs of memory gate spacers is removed to form a pair of memory gates corresponding to a remaining portion of the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a split gate memory cell with a self-aligned spacer, comprising:
   providing a substrate including a pair of select gates and a corresponding hard mask layer disposed thereover;
   forming a charge trapping layer on upper surfaces of the hard mask layer, along hard mask sidewalls, along select gate sidewalls, and over an upper surface of the substrate;
   forming a memory gate material by depositing a conductive material over the charge trapping layer;
   after forming the memory gate material, performing a planarization process that lowers the conductive material, removes an upper portion of the charge trapping layer, and stops on the hard mask layer, the lowered conductive material being coplanar with the hard mask layer;
   performing an etch of the memory gate material to leave upper sidewalls of the charge trapping layer and an upper surface of the hard mask layer exposed;
   forming a pair of memory gate spacers along the upper sidewalls of the charge trapping layer over the memory gate material; and
   removing a portion of the memory gate material not covered by the pair of memory gate spacers, thereby forming a pair of memory gates about outermost sides of the pair of select gates.

2. The method of claim 1, further comprising:
   removing a portion of the charge trapping layer located at inner sides of the pair of select gates; and
   forming a first pair of sidewall spacers covering an outer sidewall of each memory gate and a second pair of sidewall spacers covering an inner sidewall of each select gate.

3. The method of claim 2, further comprising:
   forming source/drain regions in the substrate, wherein the source/drain regions are arranged between inner sidewalls of the pair of select gates and about outer sidewalls of the pair of memory gates.

4. The method of claim 3, further comprising:
   forming a silicide layer directly on an upper region of the source/drain regions while the pairs of select gates and the pair of memory gates are covered by the hard mask layer or the memory gate spacers to prevent formation of silicide thereon;
   forming a contact etch stop layer (CESL) over the silicide layer and exposed surfaces of the split gate memory cell; and
   forming contacts extending to the source/drain regions.

5. The method of claim 1, wherein the memory gate material is formed by a process further comprises a selective plasma etching process.

6. The method of claim 1, wherein the pair of memory gate spacers is formed by forming a conformal dielectric material followed by an etching process.

7. The method of claim 1, wherein conformal dielectric liners are formed over the memory gate material and extended upwardly along the upper sidewalls of the charge trapping layer and across over the upper surface of the hard mask layer before forming the pair of memory gate spacers.

8. The method of claim 1, wherein the pair of memory gate spacers comprises silicon nitride ($Si_3N_4$).

9. The method of claim 1, further comprising:
   removing a portion of the charge trapping layer located at inner sides of the pair of select gates; and
   forming sidewall spacers covering outer sidewalls of the memory gates and inner sidewalls of the select gates.

10. The method of claim 1, wherein a portion of the conductive material at opposing inner sides of the pair of select gates is removed when patterning the conductive material according to the memory gate spacers.

11. A method of forming a split gate memory cell, comprising:
    providing a substrate including a pair of select gates and a corresponding hard mask layer disposed thereover;
    forming a charge trapping layer on upper surfaces of the hard mask layer, along hard mask sidewalls, along select gate sidewalls, and over an upper surface of the substrate;
    forming a conductive material over the charge trapping layer;
    performing an etch back process to lower portions of the conductive material at outer sides of the pair of select gates, wherein the lowered portions of the conductive material have upper surfaces lower than an upper surface of the select gates;
    forming a pair of memory gate spacers over the lowered portions of the conductive material and along upper sidewalls of the charge trapping layer; and
    patterning the conductive material according to the memory gate spacers, wherein a portion of the conductive material not covered by the memory gate spacers is removed, thereby forming a pair of memory gates along the outer sides of the pair of select gates;
    wherein a portion of the conductive material at opposing inner sides of the pair of select gates is covered by a second hard mask layer and protected from etching when performing the etch back process.

12. The method of claim 11, wherein the conductive material is planarized to remove an upper portion of the charge trapping layer and to expose the hard mask layer before performing the etch back process.

13. The method of claim 11, wherein the portion of the conductive material at opposing inner sides of the pair of select gates is removed when patterning the conductive material according to the memory gate spacers.

14. The method of claim 11, further comprising:
    removing a portion of the charge trapping layer located at inner sides of the pair of select gates; and
    forming sidewall spacers covering outer sidewalls of the memory gates and inner sidewalls of the select gates.

15. The method of claim 14, further comprising:
    forming source/drain regions in the substrate, wherein the source/drain regions are arranged between the inner sidewalls of the select gates and about the outer sidewalls of the memory gates.

16. The method of claim 15, further comprising:
forming a silicide layer on an upper region of the source/drain regions while the select gates and memory gates are covered by the hard mask layer or the memory gate spacers to prevent formation of silicide thereon;
forming a contact etch stop layer (CESL) over the silicide layer and exposed surfaces of the split gate memory cell; and
forming contacts extending to the source/drain regions.

17. The method of claim 11, wherein the pair of memory gate spacers is formed by forming a dielectric material over the conductive material and the hard mask layer, and performing an etching process to remove a lateral portion of the dielectric material and to leave a vertical portion of the dielectric material along the upper sidewalls of the charge trapping layer.

18. The method of claim 17, wherein the charge trapping layer is formed by forming a first oxide layer, a nitride layer on the first oxide layer and a second oxide layer on the nitride layer, wherein an upper portion of the nitride layer is removed when performing the etch back process, to leave a recess between the first and second oxide layers, which is then filled by the dielectric material.

19. A method of forming a split gate memory cell, comprising:
providing a substrate including a pair of select gates and a corresponding hard mask layer disposed thereover;
forming a charge trapping layer on upper surfaces of the hard mask layer, along hard mask sidewalls, along select gate sidewalls, and over an upper surface of the substrate;
forming a conductive material over the charge trapping layer which overlies the upper surface of the substrate, whereby the conductive material has a planar upper surface and leaves upper sidewalls of the charge trapping layer exposed;
forming a pair of memory gate spacers over the conductive material and along the upper sidewalls of the charge trapping layer; and
patterning the conductive material according to the memory gate spacers, wherein a portion of the conductive material not covered by the memory gate spacers is removed, thereby forming a pair of memory gates along outer sides of the pair of select gates;
wherein the portion of the conductive material at opposing inner sides of the pair of select gates is removed when patterning the conductive material according to the memory gate spacers.

20. The method of claim 19, further comprising:
removing a portion of the charge trapping layer located at the inner sides of the pair of select gates; and
forming sidewall spacers covering outer sidewalls of the memory gates and inner sidewalls of the select gates.

* * * * *